USOO5222112A

United States Patent [19]
Terasawa et al.

[11] Patent Number: 5,222,112
[45] Date of Patent: Jun. 22, 1993

[54] X-RAY PATTERN MASKING BY A REFLECTIVE REDUCTION PROJECTION OPTICAL SYSTEM

[75] Inventors: Tsuneo Terasawa, Ome; Masaaki Itou, Higashimurayama; Shigeo Moriyama, Tama; Soichi Katagiri, Hachioji; Hiroshi Fukuda, Kodaira, all of Japan

[73] Assignee: Hitachi, Ltd., Tokyo, Japan

[21] Appl. No.: 812,022

[22] Filed: Dec. 23, 1991

[30] Foreign Application Priority Data

Dec. 27, 1990 [JP] Japan .................................. 2-407559
Aug. 23, 1991 [JP] Japan .................................. 3-211877
Sep. 20, 1991 [JP] Japan .................................. 3-240806

[51] Int. Cl.$^5$ .......................... G03F 7/20; G21K 5/00
[52] U.S. Cl. ........................................ 378/34; 378/35;
378/84; 378/145; 250/492.2
[58] Field of Search ........................ 378/34, 35, 84, 85,
378/145; 250/492.2; 355/53, 67

[56] References Cited

U.S. PATENT DOCUMENTS

| 4,891,830 | 1/1990 | Iwahashi ................................ 378/35 |
| 4,945,551 | 7/1990 | Makabe et al. ........................ 378/34 |
| 5,003,567 | 3/1991 | Hawryluk et al. .................... 378/34 |
| 5,063,586 | 11/1991 | Jewell et al. .......................... 378/34 |
| 5,131,022 | 7/1992 | Terashima et al. ................... 378/34 |

FOREIGN PATENT DOCUMENTS 63-18626 1/1988 Japan .
63-312638 12/1988 Japan .
1-96600 4/1989 Japan .

Primary Examiner—David P. Porta
Assistant Examiner—Kim-Kwok Chu
Attorney, Agent, or Firm—Fay, Sharpe, Beall, Fagan, Minnich & McKee

[57] ABSTRACT

In printing patterns on a mask onto a wafer with high accuracy via a reflective reduction projection optical system by using an X-ray or vacuum ultraviolet beam there is an elliptical mirror having a source position defined in an X-ray source and a position of reflection image of entrance pupil of an imaging optical system with respect to the mask as foci and introducing means for synchronously scanning the mask and wafer. Due to inserting a plane mirror for bending an X-ray by approximately 90° at at least one point in the imaging optical system so that the plane of incidence may be perpendicular to the polarization plane the reflectivity does not lower even when the angle of incidence is 45°. A reflecting mirror or an X-ray filter having a lower reflectivity in the peripheral part thereof as compared with the reflectivity of the central part thereof in the stop position of the imaging optical system, brings about an effect of lessened influence of mutual interference between adjacent pattern provides pattern printing with high shape accuracy.

36 Claims, 8 Drawing Sheets

CONFIGURATION OF FINE PATTERN PRINTING APPARATUS

DIVERGENCE OF BEAM EMMITED FROM LIGHT SOURCE

X-RAY PATTERN MASKING BY A REFLECTIVE REDUCTION PROJECTION OPTICAL SYSTEM

BACKGROUND OF THE INVENTION

Projection exposure systems for printing circuit patterns such as semiconductor devices drawn on masks onto wafers are requested to fulfill the performance of printing fine patterns with high resolution. In general, the greater the numerical aperture (NA) of the exposure lens becomes or the shorter the wavelength of exposure light becomes, the better the resolution becomes. Methods of making the NA large bring about lowering in depth of focus at the time of pattern printing, and hence there is a limit in magnitude of NA. Therefore, studies for improving resolution by using short wavelength beams such as X-rays have heretofore been made. As the wavelength becomes shorter, however, the beam is absorbed more easily. Therefore, it is difficult to realize an imaging optical system using a transmissive lens like conventional exposure systems using a mercury lamp as the light source. Therefore, methods using a reflective imaging optical system have been proposed.

Conventional reflective imaging optical systems premised on the assumption that X-rays are used are described in JP-A-63-18626 and JP-A-63-312638. In each of these conventional examples, configuration of an imaging optical system for printing mask patterns onto a wafer is studied in detail. As for the proximity exposure in which patterns are printed under the condition that the mask is in close vicinity to the wafer, an illumination optical system in which an exposure field is expanded by scanning a reflecting mirror is disclosed in JP-A-1-96600. Further, in JP-A-63-62231, introduction of a mirror for providing arc field illumination in printing mask patterns by using an imaging optical system having one or two reflecting mirrors is described.

SUMMARY OF THE INVENTION

In the above described prior art, it is not considered to reconcile, in pattern printing, resolution improvement by deflecting a beam so emitted from the light source as to diverge in one plane into a direction matched with the reflective imaging optical system and enlargement of the exposure field. Further, the X-ray emitted from the X-ray source has an intense electric vector parallel to a particular plane. Unless the plane of this intense electric vector and a reflecting mirror for bending the X-ray by 90° are kept in a particular positional relation, the X-ray cannot arrive at above the wafer efficiently, resulting in a problem. Further, there is a large degree of spatial coherence. In case fine patterns arranged complicatedly are to be printed, therefore, projected images are degraded by the influence of mutual interference between adjacent patterns, resulting in another problem. Further, in the above described prior art, prevention of degradation of projected images are not considered at all.

Therefore, a first object of the present invention is to provide, in a reflective exposure system using an X-ray beam or a vacuum ultraviolet beam as the exposure radiation, a method of and apparatus for printing fine patterns with high resolution by deflecting the above described beam so emitted from the radiation source as to diverge in one plane into a direction matched with the reflective imaging optical system and by thus illuminating the mask efficiently.

A second object of the present invention is to provide a method of and apparatus for printing fine patterns with high efficiency of utilization by forming a reflective imaging optical system with due regard to the polarization plane of the electric field of the X-ray emitted from the X-ray source.

A third object of the present invention is to provide, in a reflective exposure system using an X-ray beam or a vacuum ultraviolet beam as the exposure radiation, an X-ray projection exposure method and its apparatus, in which projected images are not degraded by the proximity effect even if the degree of spatial coherence is large.

The above described first object is achieved by introducing an elliptical mirror having the source position of the exposure beam and the position of the reflected image of the entrance pupil of the imaging optical system with respect to the mask as two faci, by illuminating a narrow arc field on the mask plane with a beam reflected by the elliptical mirror, and by using means for synchronously scanning the mask and wafer.

Further, the above described second object is achieved by so forming an exposure system that the plane (hereafter referred to as incidence plane) including an incident beam and a reflected beam when an exposure beam is reflected by the above described 90° bending reflecting mirror and the oscillation plane (hereafter referred to as polarization plane) of the electric field of the beam may not be parallel but may be perpendicular to each other.

Further, the above described third object is achieved by providing a reflecting mirror having a lower reflection factor in the peripheral part as compared with the central part at the position of the stop (diaphragm) of the imaging optical system for performing reduction projection of a pattern drawn on a mask which is a first substrate onto a wafer which is a second substrate, or by proving an X-ray filter having a lower transmission factor in the peripheral part as compared with the central part at the position of the stop of the above described imaging optical system.

The elliptical mirror having the source position of the exposure beam and the position of the reflected image of the entrance pupil of the imaging optical system with respect to the mask as two faci serves as a reflective illumination optical system for illuminating the mask. By suitably selecting the shape of the elliptical mirror, it is especially possible to transform the beam having a rectangular cross section so emitted from the light source as to diverge in one plane into a beam, which is focused along the side face of a circular cone having a position of the reflected image of the entrance pupil of the imaging optical system with respect to the mask as the vertex. If at this time the plane in which the mask is placed and the reflective imaging optical system are so disposed as to be rotationally symmetric and this axis of symmetry is squared with the central axis of the above described circular cone, then the focused beam illuminates an arc field on the mask and the principal ray reflected by the mask is entirely directed to the entrance pupil of the imaging optical system. Therefore, the pattern located in the arc field on the mask is printed onto the wafer via the imaging optical system. All patterns drawn on the mask can be printed by synchronously scanning the mask and wafer.

The reflecting mirror for bending the X-ray by nearly 90° when the angle of incidence is approximately 45° is required to prevent a first substrate or a second substrate from blocking the optical path of the imaging optical system when a pattern on the first substrate is to be printed onto the second substrate by using the reflective imaging optical system. Since the exposure beam is an X-ray beam or a vacuum ultraviolet beam, the reflecting mirror is a multi-layer mirror. In case the angle of incidence is 45°, the reflectivity is extremely small when the incidence plane of the multi-layer mirror is in parallel to the polarization plane of the above described X-ray beam. When those planes are perpendicular to each other, however, a practical reflectivity is obtained. By such a configuration that the polarization plane of the beam or the oscillation plane of the strongest electric field may be perpendicular to the incidence plane when the beam contributing to the pattern printing is incident upon the reflecting mirror with an angle of incidence equivalent to 45°, therefore, the maximum reflectivity is obtained in the reflecting mirror, resulting in pattern printing with high efficiency of beam utilization.

When viewed from the above described first substrate side, the reflecting mirror disposed at the position of the stop (diaphragm) of the imaging optical system corresponds to the entrance pupil of the above described imaging optical system. Therefore, that reflecting mirror functions as a spatial frequency filter of the imaging optical system. Generally, an image improving method for changing a projected image to a desired image by placing a filter for providing changes in transmittance and phase in the pupil position of the imaging optical system is described on page 439 and following pages of a book written by Hiroshi Kubota, entitled "Wave Optics", and published by Iwanami Shoten. Therein, there is described an apodization filter aiming at obtaining an image having smaller divergence by weakening diffraction images of higher order. The reflecting mirror or the transmission filter disposed in the position of the stop (diaphragm) corresponding to the entrance pupil of the imaging optical system according to the present invention serves as an apodization filter because of its distribution of reflection factor or transmittance, and hence prevents degradation of the projected image caused by the proximity effect at the time of pattern printing.

DESCRIPTION OF THE PREFERRED EMBODIMENTS

Figure 1:
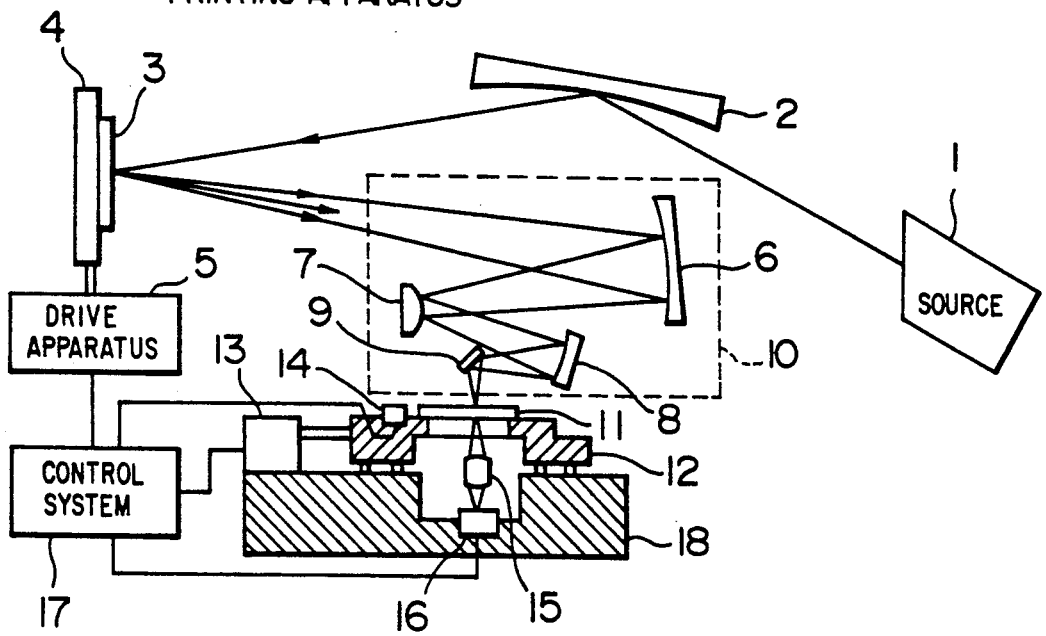
FIG. 1 is a concept diagram of an apparatus for printing fine patterns which is an embodiment of the present invention.

Embodiments of the present invention will hereafter be described. FIG. 1 is a diagram showing an apparatus for printing fine patterns according to the present invention using an electron storage ring as an X-ray source 1 and using an X-ray (synchrotron radiation) emitted therefrom as exposure radiation, for example. The X-ray emitted from the X-ray source 1 is reflected by one elliptical mirror 2 serving as radiation optical system to radiate a mask 3 which is a first substrate. A reflected beam from the mask 3 arrives at a wafer 11, which is a second substrate, through a reflective imaging optical system 10 including a concave mirror 6, a convex mirror 7, a concave mirror 8 and a plane mirror 9. As a result, a pattern drawn in radiated field on the mask 3 is printed onto the wafer 11. By synchronously scanning a stage 4 mounting the mask 3 and a stage 12 mounting the wafer 11 according to the magnification of the reflective imaging optical system 10, all patterns on the mask 3 can be printed onto the wafer 11.

Herein, every reflective surface is a multilayer structure including alternate laminates of Mo (molybdenum) and Si (silicon). The reflective surface is so adapted as to provide a reflectivity of at least 40% for an X-ray having a wavelength of 14 nm when the angle of incidence is in the range of 0 to 10 degrees. Further, every surface of the concave mirror 6, convex mirror 7 and concave mirror 8 is a rotationally symmetric surface about one central axis or a surface obtained by cutting a part thereof.

Figure 7:
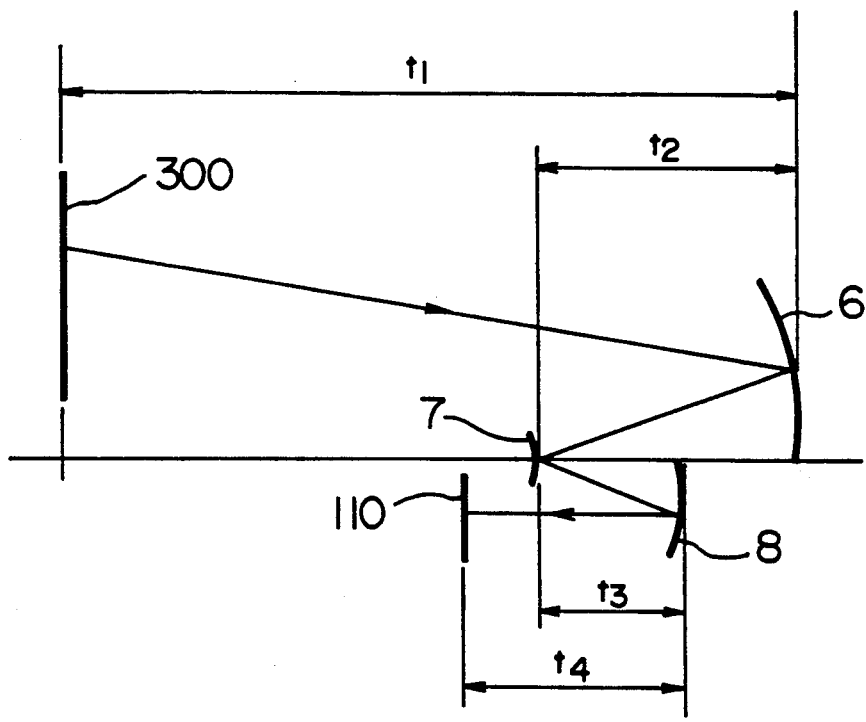
FIG. 7 is a diagram showing the ray path of a principal ray in an imaging optical system of the apparatus for printing fine patterns.

FIG. 7 is a diagram obtained by extracting a part relating to imaging performed by the concave mirror 6, convex mirror 7 and concave mirror 8 out of the fine pattern printing apparatus shown in FIG. 1. Since the plane mirror 9 merely changes the ray direction of the X-ray and it does not govern the imaging performance, it is omitted in FIG. 7. It is now assumed that each distance between optical elements is represented by a distance on the central axis of the optical system. As shown in FIG. 7, it is now assumed that $t_1$ denotes the distance between a substance face 300 corresponding to the mask 3 and the concave mirror 6, $t_2$ the distance between the concave mirror 6 and the convex mirror 7, $t_3$ the distance between the convex mirror 7 and the concave mirror 8, $t_4$ the distance between the concave mirror 8 and the image face 110 corresponding to the surface of the wafer 11, $r_1$ the radius of curvature at the vertex of the concave mirror 6, $r_2$ the radius of curvature at the vertex of the convex mirror 7, $r_3$ the radius of curvature at the vertex of the concave mirror 8, $c_1$ the conical constant representing the aspherical amount of the face of the concave mirror 6, $c_2$ the conical constant representing the aspherical amount of the face of the convex mirror 7, and $c_3$ the conical constant representing the aspherical amount of the face of the concave mirror 8. In the present embodiment, the following values are chosen as the above described parameters for example.

$t_1 = 1000.0$ mm, $t_2 = -149.863$ mm, $t_3 = 70.003$ mm, $t_4 = -120.951$ mm, $r_1 = -393.970$ mm, $r_2 = 108.6567$ mm, $r_3 = -149.640$ mm, $c_1 = -0.94301$, $c_2 = -0.09193$, $c_3 = 0.14273$

Figure 2:
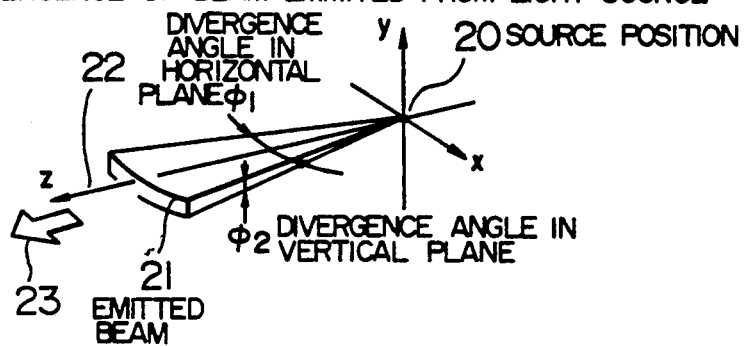
FIG. 2 is a concept diagram showing the radiation state of an X-ray emitted from a radiation source.
Figure 3:
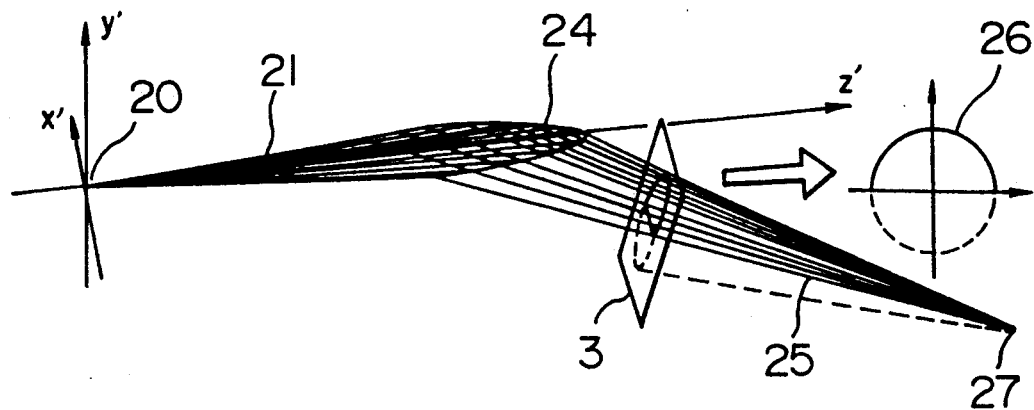
FIG. 3 is a diagram showing the ray path of mask illumination radiation in the apparatus for printing fine patterns.

The synchrotron radiation used as exposure radiation is emitted from one point 20 as an X-ray 21 having a divergence angle $\phi_1$ in the horizontal plane and a divergence angle $\phi_2$ in the vertical plane as shown in FIG. 2. In fact, the divergence angle $\phi_2$ of the X-ray 21 in the vertical plane is approximately 1 mrad and is sufficiently small as compared with the divergence angle $\phi_1$ of several tens mrad. Therefore, the X-ray travels in a direction indicated by an arrow 23 in the horizontal plane along a z-axis 22 set in the horizontal plane. With the exception of the plane mirror 9, the imaging optical system 10 has a rotationally symmetric shape. As shown in FIG. 3, therefore, the function required of the reflecting mirror 2 is to deflect the X-ray 21 so emitted as to have a rectangular cross section in a position denoted by 24 and convert the X-ray 21 into an X-ray 25 which illuminates an arc field 26 on the mask 3 and converges to an entrance pupil 27 of the imaging optical system. In order to clarify the function of the radiation optical system, a mask of transmission type is chosen as the mask 3 in FIG. 3. In case of a reflective mask, however, a radiation source 20 and the X-ray 21 are disposed on the right side of the mask 3.

Figure 4:
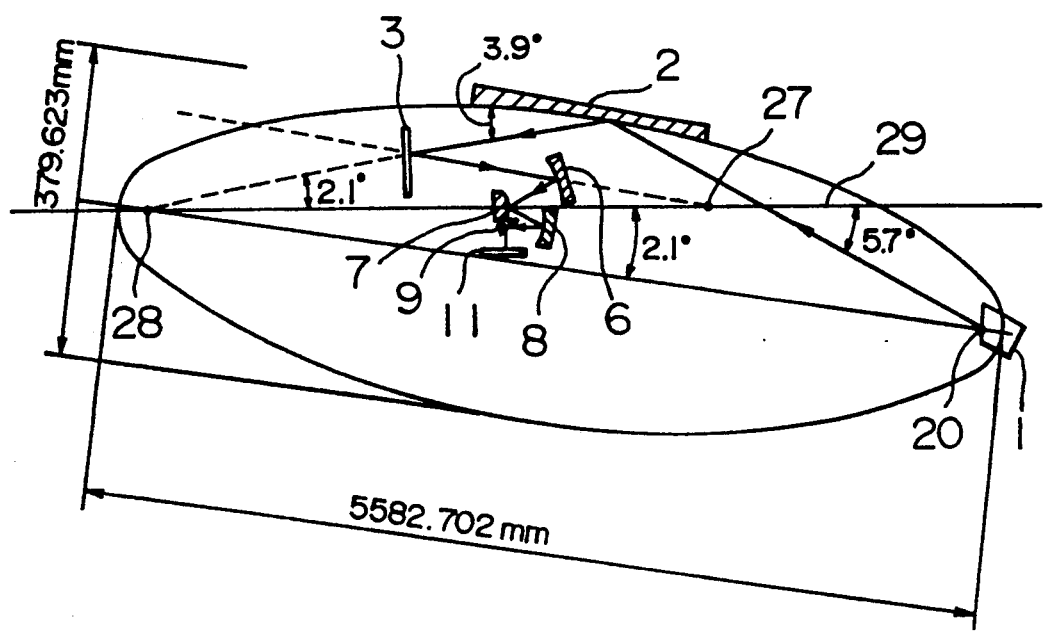
FIG. 4 is a diagram showing the ray path of a beam in the apparatus for printing fine patterns.

The basic configuration of the exposure optical system obtained when the reflecting mirror 2 having the above described function is introduced and the ray path of an X-ray radiating a representative point on the mask 3 and the 0-th order diffracted light reflected by the mask 3 are shown in FIG. 4. The X-ray emitted from the X-ray source 1 diverges in the horizontal plane (i.e., a plane perpendicular to the paper). In FIG. 4, however, the axis of the imaging optical system is shown in the horizontal direction for convenience. Every surface of the concave mirror 6, convex mirror 7 and concave mirror 8 is a rotationally symmetric surface about one central axis 29 or a surface obtained by cutting a part thereof. Assuming now that the position of the reflected image of the above described entrance position 27 with respect to the mask 3 is denoted by 28, the point 28 is present on the axis 29 with the entrance position or pupil 27. The X-ray emitted from the X-ray Source 1 is now regarded as radiated from the source point 20. An ellipsoid of revolution having the point 20 and the point 28 as foci will now be considered. A surface obtained by cutting a part of this ellipsoid has been chosen as the shape of the elliptical mirror 2 functioning as the radiation optical system. When the equation of an ellipse on a plane containing the axis of rotation of an ellipsoid of revolution is expressed by a normal form as $X^2/a^2 + Y^2/b^2 = 1$, 2791.351 mm and 189.812 mm have been chosen as values of a and b in the present embodiment. As a result, the X-ray emitted from one point 20 on the X-ray source 1 is reflected by the elliptical mirror 2, and travels along the side face of a circular cone having the axis 29 and the point 28 respectively as the central axis and the vertex to illuminate the mask 3 so as to form an arc. Further, the 0-th order diffracted radiation reflected by the mask 3 becomes a beam traveling toward the entrance pupil 27 of the imaging optical system. At this time, the length of the major axis of the ellipsoid of revolution defining the elliptical mirror 2 is 5582.702 mm and the length of the minor axis thereof is 379.623 mm. Even when the above described elliptical mirror is approximated by a toroidal mirror, a substantially identical function can be obtained.

Since the axis 29 of the imaging optical system contains the point 28 and the axis 29 lies between the X-ray source 1 and the reflection point of the X-ray on the elliptical mirror 2, the axis 29 is inclined from the horizontal plane. In the present embodiment, the axis 29 is inclined by approximately 5.7°. Therefore, the mask 3 must also be inclined by approximately 5.7° with respect to the vertical plane. Further, the major axis of the ellipsoid of revolution defining the elliptical mirror 2 and the central axis 29 of the imaging optical system are inclined from each other by 2.1°. The wafer 11 can be placed in the horizontal plane by adjusting the attitude of the plane mirror 9.

Figure 5:
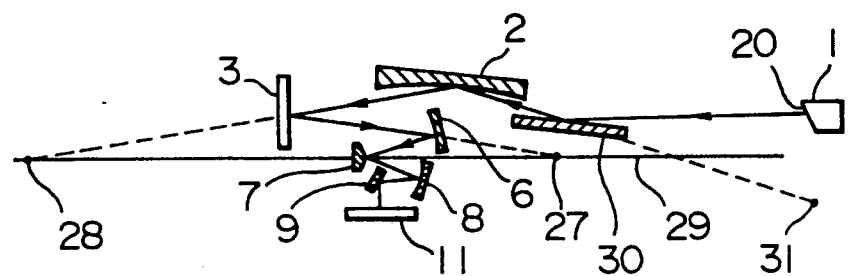
FIG. 5 is a diagram showing the ray path of a beam generated by another radiation system of the apparatus for printing fine patterns.

By inclining the X-ray incident upon the elliptical mirror 2, inclination of the axis 29 of the imaging optical system can be avoided. FIG. 5 shows an example of disposition of a plane mirror 30 between the X-ray source 1 and the elliptical mirror 2. The source position 20 of the X-ray source 1 is regarded as if it is positioned at a point 31. Even if the plane mirror 30 is disposed between the elliptical mirror 2 and the mask 3, a similar effect is obtained. Since the reflecting mirror used here is a multi-layer mirror in most cases, however, a radiation optical system including only the elliptical mirror 2 is ideally desirable from a viewpoint of reflection efficiency. Since the elliptical mirror 2, the plane mirror 30, the mask 3 or the reflecting mirror included in the imaging optical system 10 absorbs a part of the X-ray as heat, it is desirable to provide cooling means in order to avoid registration error caused by thermal deformation. In the present embodiment, cooling means is disposed on the multi-layer elliptical mirror 2 and this is used as a bandpass filter to absorb X-rays other than the X-ray of the exposure wavelength.

With reference to FIG. 1, the wafer 11 is mounted on the stage 12 which can move in a 2-dimensional or 3-dimensional direction. A mark is formed on the rear surface of the wafer 11. This mark position is detected by using a detection optical system 15 disposed on the stage 12 side and a detector 16 disposed on a base 18 and under the detection optical system 15. Thus the mounting position of the wafer 11 is detected accurately. On the basis of the result of detection, a control system 17 determines the position or timing of scanning start of the mask 3 and the wafer 11. The control system 17 drives drive means 5 of the stage 4 mounting the mask 3 and drive means 13 of the stage 12 so that the mask 3 and the wafer 11 may be scanned synchronously according to the magnification of the imaging optical system 10. Detection of the position of the mark disposed on the rear surface of the wafer 11 may be performed by stopping the stage 12, or may be performed by disposing a large number of marks and detecting the time when the mark image passes through a predetermined position on the detector 16 while scanning the stage 12. Further, in the present embodiment, visible laser light is used as the detection light. However, the wavelength region of the detection light is not limited to this, but an X-ray, ultraviolet light or infrared light may also be used.

On the surface of the stage 12 mounting the wafer 11, at least one X-ray dose detector 14 is disposed. The result of detection in this detector 14 is transferred to the control system 17. Radiation on the wafer 11 is thus calculated. The control system 17 controls the speed of synchronous scanning of the mask 3 and the wafer 11 so that a predetermined X-ray dose may be obtained.

Figure 6:
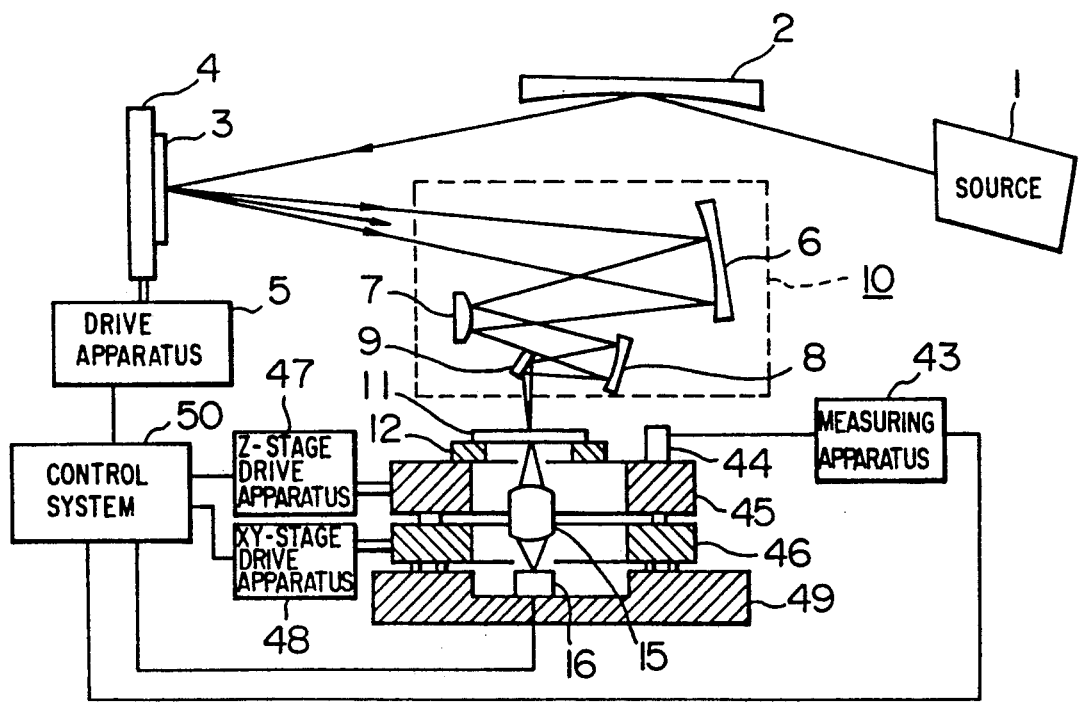
FIG. 6 is a more detailed configuration diagram of an apparatus for printing fine patterns which is an embodiment of the present invention.

FIG. 6 shows a fine pattern printing apparatus of the present invention using an electron storage ring as an X-ray source 1 and using an X-ray (synchrotron radiation) emitted therefrom as exposure radiation, for example. The X-ray emitted from the X-ray source 1 is reflected by an elliptical mirror 2 serving as the radiation optical system to illuminate a mask 3 which is a first substrate. The elliptical mirror 2 may be replaced by a toroidal mirror. A reflected beam from the mask 3 arrives at a wafer 11, which is a second substrate, through a reflective imaging optical system 10 including a concave mirror 6, a convex mirror 7, a concave mirror 8 and a plane mirror 9. As a result, a pattern drawn in an illuminated field on the mask 3 is printed onto the wafer 11. If the illuminated field on the mask 3 is narrow, all patterns on the mask 3 can be printed onto the wafer 11 by synchronously scanning a stage 4 mounting the mask 3 and a wafer table 12 mounting the wafer 11 according to the magnification of the reflective imaging optical system 10.

The wafer table 12 is fixed on a z-stage 45 which can move in a direction perpendicular to the surface of the wafer 11. The z-stage 45 is mounted on an xy-stage 46 which can move in the surface direction of the wafer 11. As for the mounting position error of the wafer 11, a mark formed on the rear face is detected by a position detector 16 via a detection optical system 15. The result of detection is sent to a control system 50. On the other hand, measurement of movement position of the wafer 11 is performed by measuring the position of a mirror 44 fixed on the stage 45 with a laser length measuring machine 43. The result of measurement is sent also to a control system 50. By controlling stage drive means 5, z-stage drive means 47 and xy-stage drive means 48, the control system 50 keeps the mask 3 and the wafer 11 relative to base 49 in a desired positional relation.

Herein, every reflective surface has a multi-layer structure including alternate laminates of Mo (molybdenum) and Si (silicon). The reflective surface is so adapted as to provide a reflectivity of at least 40% for an X-ray having a wavelength of 14 nm. Arrangement of a concave mirror 6, a convex mirror 7 and a concave mirror 8 is represented by FIG. 7 in the same way as the first embodiment. Parameters such as surface intervals $t_1$, $t_2$, $t_3$ and $t_4$ also have the same values as those of the first embodiment.

Figure 8:
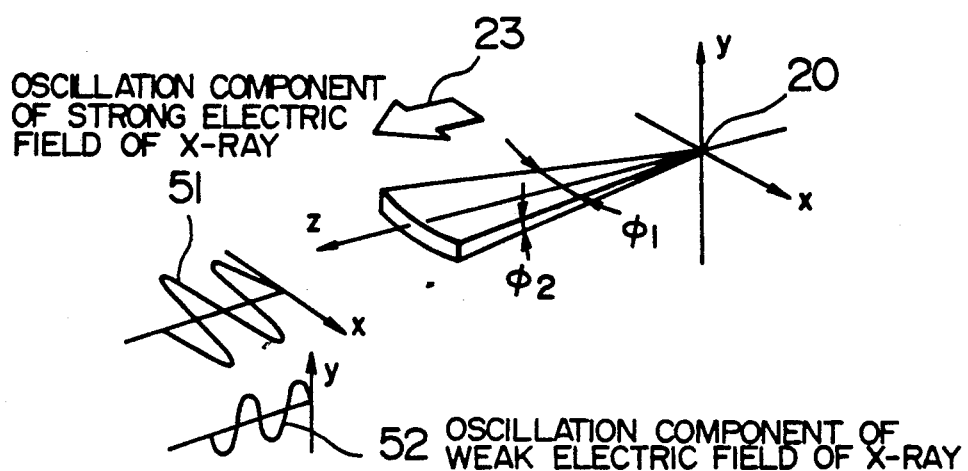
FIG. 8 is a diagram showing the radiation state and oscillation direction of an X-ray.

The synchrotron radiation used as exposure radiation is emitted from one point 20 in a direction indicated by an arrow 23 as an X-ray having a divergence angle $\phi_1$ in the horizontal plane and a divergence angle $\phi_2$ in the vertical plane as shown in FIG. 8. In fact, the divergence angle $\phi_2$ of the X-ray in the vertical plane is approximately 1 mrad and is sufficiently small as compared with the divergence angle $\phi_1$ of several tens mrad. Therefore, the X-ray travels along a z-axis set in the horizontal plane. In the electric field of this X-ray, a component 51 oscillating in the horizontal plane (i.e., in the xz-plane) is larger than a component 52 oscillating in the vertical plane (i.e., in the yz-plane) by at least one digit. In substance, therefore, the X-ray can be regarded as polarized radiation having the vibration plane of electric field in the horizontal plane.

Figure 9:
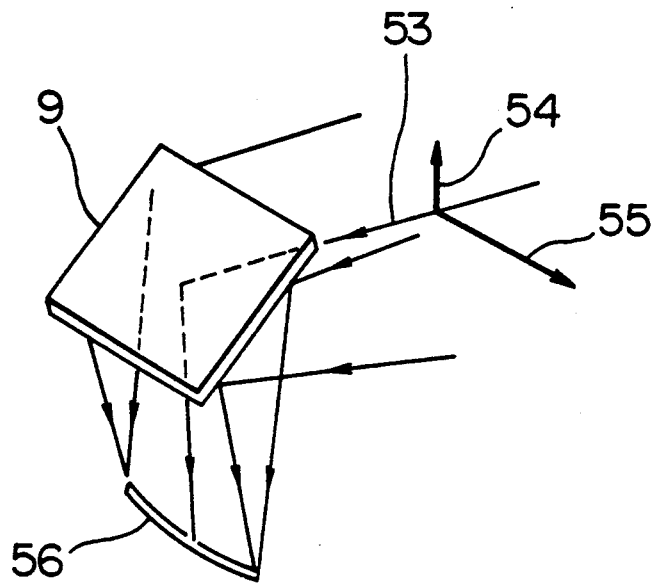
FIG. 9 is a diagram showing a plane mirror for reflecting an X-ray so as to bend it by 90° and the polarization state of the X-ray.
Figure 10:
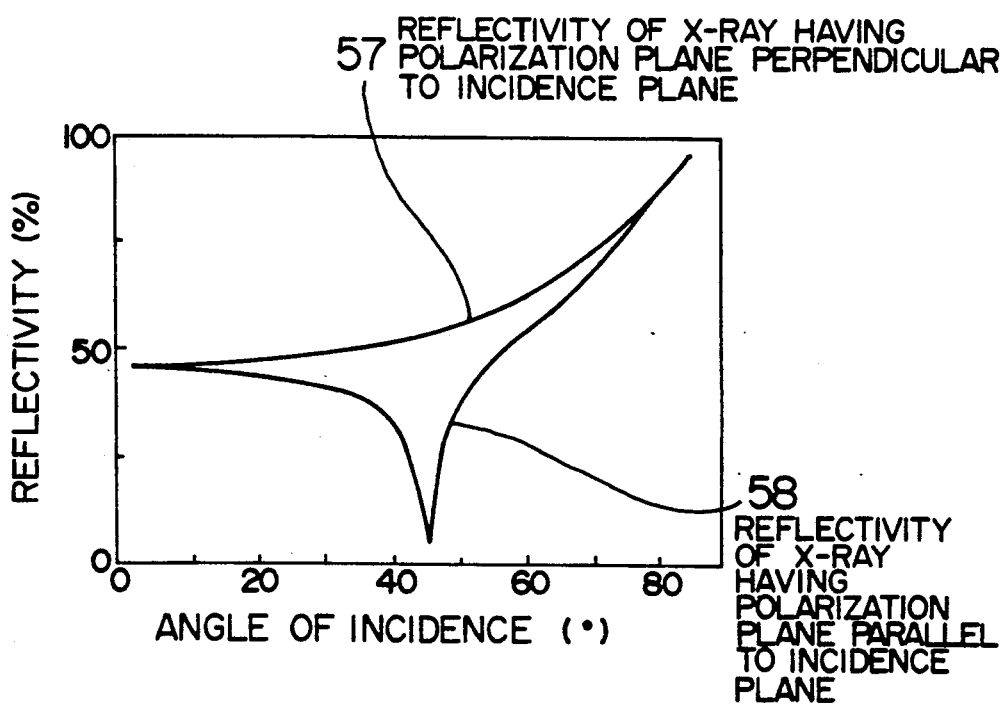
FIG. 10 is a diagram showing dependence of X-ray reflectivity upon the angle of incidence in a multi-layer mirror.

The X-ray having the above described polarization plane passes through the path shown in FIG. 6 and the X-ray is then bent by a multi-layer plane mirror 9 to form a pattern image 56. A part relating to this is shown in FIG. 9. A principal ray 53 of the X-ray flux has electric field vectors 54 and 55 immediately before it is incident upon the plane mirror 9. It is known that X-ray multi-layer mirrors such as that used in the embodiment of the present invention have reflection characteristics as shown in FIG. 10. That is to say, the reflectivity for polarized light having an electric field vector perpendicular to the incidence plane changes monotonously as represented by a curve 57, while the reflectivity for polarized light having an electric field vector in the incidence plane decreases sharply near the angle of incidence of 45°. In FIG. 9, therefore, the component represented by the vector 54 is scarcely reflected, and only the component represented by the vector 55 is reflected. In the present embodiment, the X-ray for pattern printing is incident upon the elliptical mirror 2 with an angle of incidence of at least 80° and incident upon the mask 3 and the reflecting mirrors 6, 7 and 8 with angles of incidence of 10° or less. On the basis of the reflection characteristics shown in FIG. 10, therefore, it is understood that the polarization plane of the X-ray 53 incident upon the reflecting mirror 9 is almost identical with that of the X-ray generated from the radiation source 20. That is to say, the component represented by the vector 55 in FIG. 9 is larger than the component represented by the vector 54 by at least one digit. Therefore, the reflecting mirror 9 shown in FIG. 9 reflects the strong electric field component represented by the vector 55. If the direction of the plane mirror 9 is changed to bend the principal ray 53 in the same plane as that of the vector 55 by 90°, the weak electric field component is scarcely reflected, the utilization efficiency of X-ray being sharply reduced.

In the present embodiment, an electron storage ring is used as the X-ray source 1. Therefore, the X-ray emitted therefrom has been handled as polarized radiation having a polarization plane in the horizontal plane as shown in FIG. 8. Even if the polarization plane is changed by using another X-ray source or another imaging optical system, it is necessary to avoid parallelism of the incidence plane to the polarization plane when the X-ray is to be bent by approximately 90° by using a plane mirror. As a matter of course, it is rather necessary in this case to make the incidence plane and the polarization plane perpendicular to each other.

Another embodiment of the present invention will now be described. In the fine pattern printing apparatus described with reference to the second embodiment and shown in FIG. 6, the convex mirror 7 has graded thickness multi-layer so that the reflectivity of the peripheral part may become lower than the reflectivity of the central part as represented by a curve 60 shown in FIG. 11. The method for changing the reflectivity is not limited to the above described method. For example, a method such as changing the number of layer pairs of the multi-layer structure, performing ion implantation after multi-layer formation, or forming an absorber having suitable distribution of layer thickness on the multi-layer structure may be used. Since this convex mirror 7 corresponds to the stop position of the imaging optical system 10, the reflectivity distribution shown in FIG. 11 serves as a spatial frequency filter.

Figure 12:
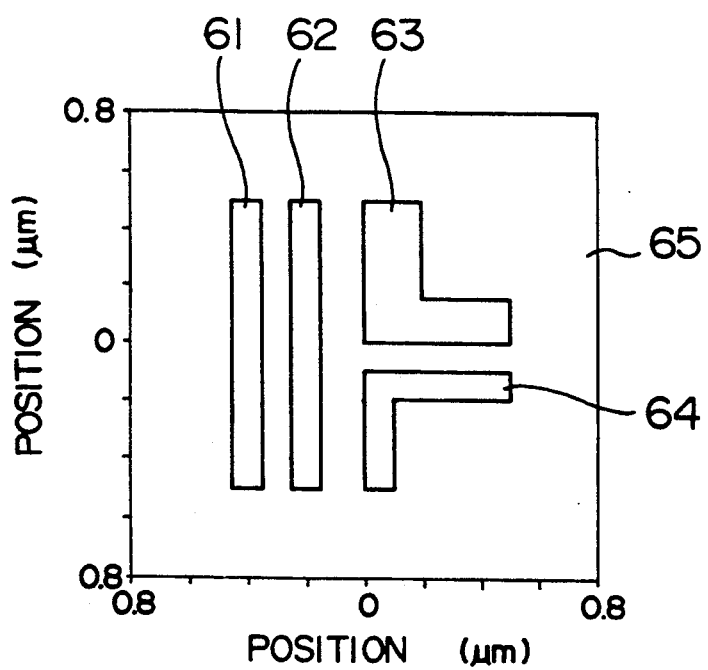
FIG. 12 is a diagram showing an example of a mask pattern.
Figure 13:
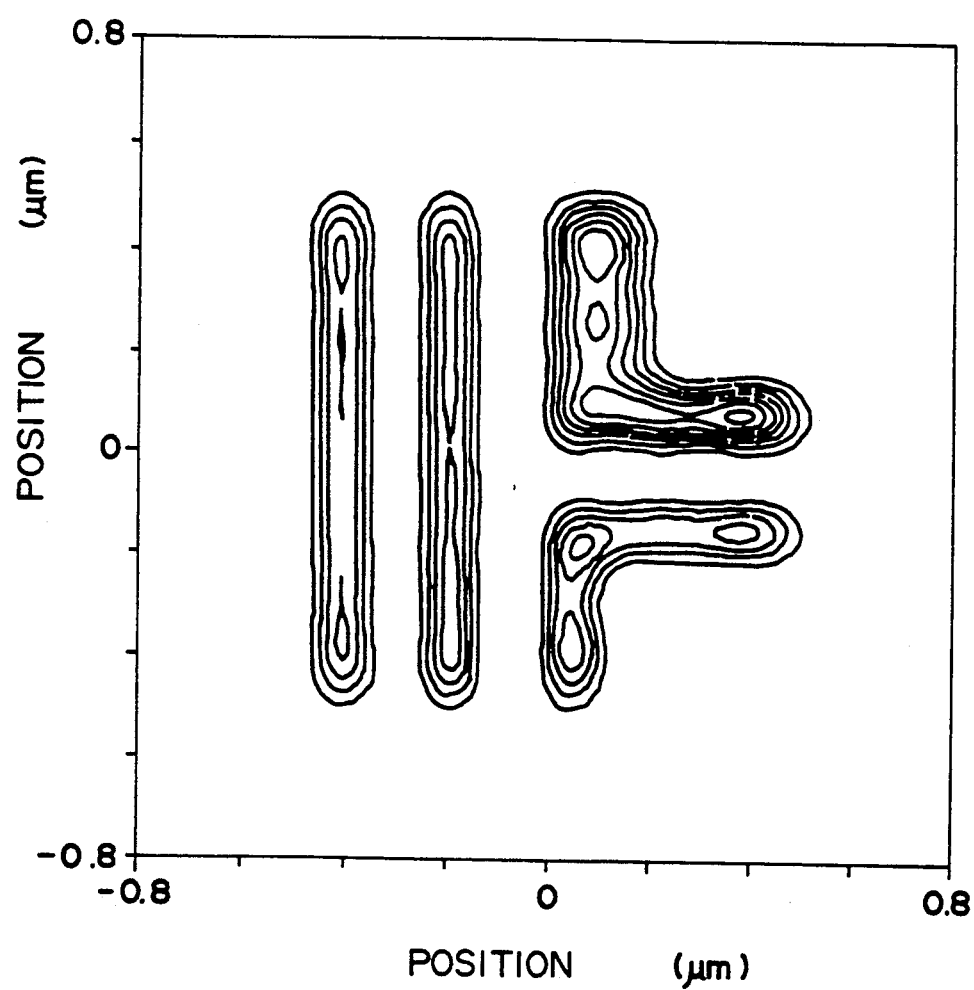
FIG. 13 is a diagram showing a calculated projection image obtained when the present invention is implemented.
Figure 14:
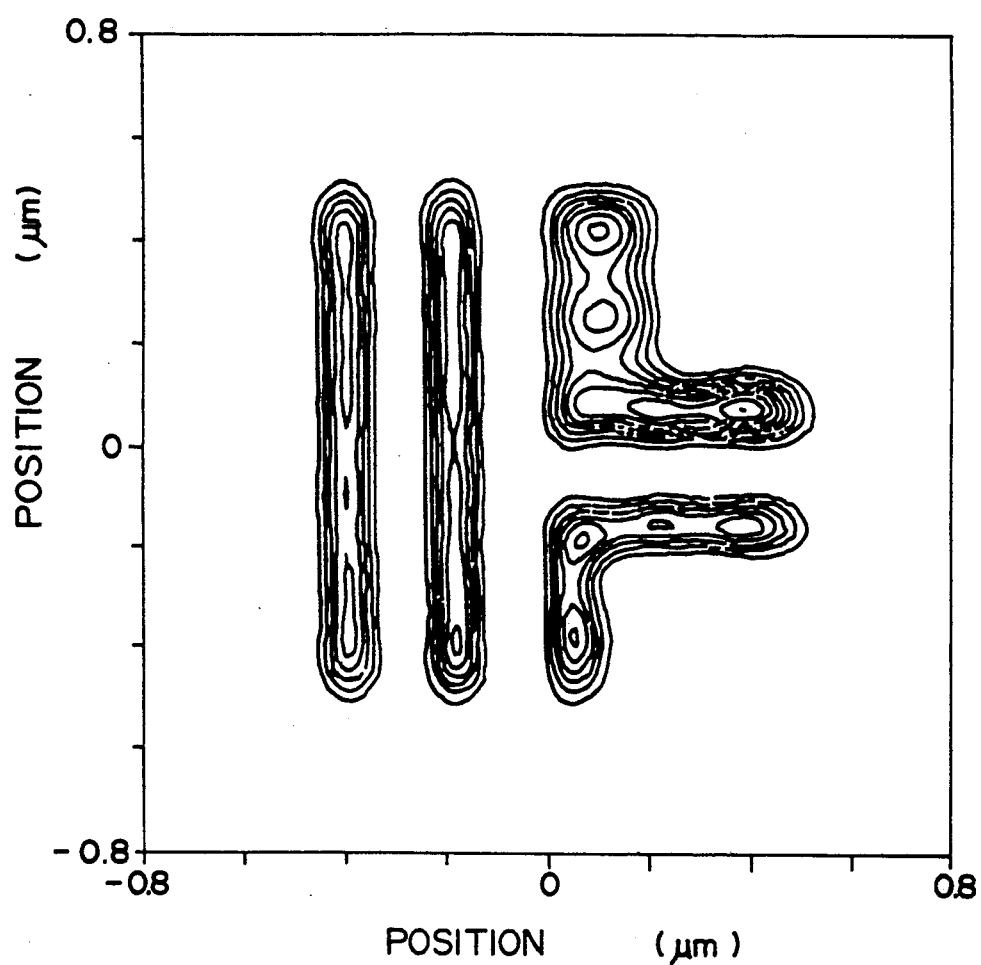
FIG. 14 is a diagram showing a calculated projection image with a strong interference effect obtained when the present invention is not implemented.

The pattern projection image obtained when the present invention is implemented will now be described. FIG. 12 shows an example of the pattern on the mask 3. With reference to FIG. 12, a field 65 is a field which does not reflect X-rays and fields 61, 62, 63 and 64 are fields for defining patterns by reflecting X-rays. FIG. 13 shows a contour map of X-ray intensity distribution of the projected image obtained when the reflectivity of the peripheral part of the convex mirror 7 is half of the reflectivity of the central part. On the other hand, FIG. 14 shows a projected image obtained when the present invention is not implemented. In the present embodiment, an imaging optical system including a multi-layer mirror is used and hence the wavelength region of the X-ray contributing to pattern formation is narrow. Further, since the radiation source 1 can be substantially regarded as a point source of radiation, the system shown in FIG. 6 is an imaging system which is extremely close to coherent. In the projected image shown in FIG. 14, therefore, the effect of interference appears markedly and the image is degraded from the viewpoint of intensity distribution and shape accuracy. As shown in FIG. 13, however, the image obtained when the present invention is implemented is less than the image of FIG. 14 in degradation. That is to say, the influence of interference from adjacent patterns is slight and the shape accuracy has been improved.

Figure 11:
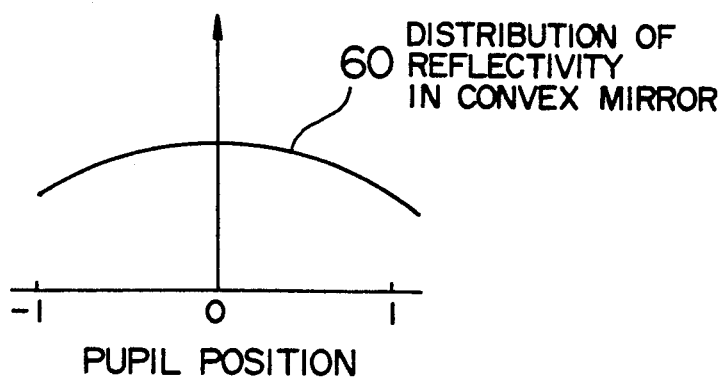
FIG. 11 is a diagram showing the distribution of reflectivity of a reflecting mirror disposed in the position of a stop (diaphragm) of an imaging optical system.

The reflectivity distribution of the convex mirror 7 is not limited to the distribution monotonously decreasing in the radial direction as shown in FIG. 11. Further, the multi-layer structure may be provided with distribution so as to change the phase. If a reflecting mirror suitably provided with reflectivity distribution or phase distribution is used, it is also possible to improve the depth of focus or resolution of the projected image. In the present embodiment, the convex mirror 7 is disposed at the stop of the imaging optical system to provide reflectivity distribution. In a system in which a reflective surface is not present in the stop position of the imaging optical system, a similar effect is obtained even if a thin film filter having distribution of X-ray transmittance is disposed near the stop position. Further, since the beam concentrates upon the convex mirror 7 or an X-ray transmission filter having the above described filter characteristics, absorbed power probably causes a rise in temperature. In this case, cooling means may be suitably provided.

The term "pattern printing" means radiating a beam such as an X-ray onto resist applied to a wafer to expose the resist to the beam and form a latent image. Since the present invention relates to an optical system for forming a mask pattern image on the wafer by using an X-ray, however, the present invention is not limited to use of resist but may be applied to direct working of a sample surface by means of X-ray radiation or working using an X-ray for photo-assist process, for example.

By introduction of one elliptical mirror having a predetermined shape, the present invention makes it possible to shape an X-ray or vacuum ultraviolet beam having a rectangular cross section into an arc form to illuminate a mask. As a result, imaging performance of a rotationally symmetric imaging optical system can be brought out sufficiently. In addition, introduction of synchronous scanning means of the mask and wafer brings about an effect that fine patterns can be printed with high precision. Further, owing to introduction of a multi-layer reflective bandpass filter into the illuminating optical system to limit the wavelength region, degradation of precision due to a temperature rise in the mask and imaging optical system can be prevented. Further, since the speed of synchronous scanning of the mask wafer can be changed according to the beam intensity, it becomes possible to print patterns stably with a constant dose at all times.

In an apparatus for printing patterns by using an X-ray or vacuum ultraviolet beam and a multi-layer mirror according to the present invention, a plane mirror for deflecting the beam by approximately 90° is so inserted that the polarization plane of the beam or the oscillation plane of the strongest electric field may be perpendicular to the incidence plane by using an emitting light source. As a result, the maximum reflectivity of a reflecting mirror is obtained and pattern printing with a high efficiency of beam utilization is performed.

Further, even if the X-ray projection optical system is a spatially coherent system, the present invention brings about an effect of lessened influence of mutual interference between adjacent patterns, pattern printing with high shape accuracy being realized.

What is claimed is:

1. A fine pattern printing method for performing reduction projection of a pattern drawn on a mask onto a substrate via an imaging optical system by using an source emitting an X-ray or vacuum ultraviolet beam, said fine pattern printing method comprising the steps of:
   disposing an optical element between said source and said mask to apply said beam onto said mask in an arc form; and
   disposing optical elements for deflecting said beam so as to direct a 0-th order diffracted portion of said beam from said mask toward an entrance pupil position of said imaging optical system.

2. The method of claim 1, including providing said beam with a flat narrow rectangular cross-sectional image shape at a position between the source and the optical element.

3. The method of claim 2, wherein said disposing changes the flat narrow rectangular cross-sectional shape to a narrow arc field.

4. The method of claim 3, wherein said providing provides the beam as polarized radiation with a vibrating plane of the electric field extending in a plane of the longest side of the rectangular shape.

5. The apparatus of claim 4, including forming said mask on a flat plane.

6. An apparatus for printing fine patterns on a substrate, comprising:
   a radiation source for emitting an X-ray or vacuum ultraviolet beam;
   means for deflecting said beam into a predetermined direction to form an arc radiation field on a mask to produce a masked beam;
   reflective imaging optical means for focusing the masked beam onto the substrate; and
   scanning means for synchronously moving the mask and the substrate in their respective planes relative to said source, means for deflecting and optical means.

7. An apparatus for printing fine patterns according to claim 6, wherein said means for deflecting comprises an elliptical mirror, and said elliptical mirror having the shape of an ellipsoid of revolution having a position of said light source and an entrance pupil position with respect to said mask as foci.

8. An apparatus for printing fine patterns according to claim 7, wherein the beam emitted from said source is mainly a divergent beam diverging in one plane, and said beam between said means for deflecting and the mask is a converging beam wherein the plane travels along a surface of a circular cone having a focus different from said source of said elliptical mirror as a vertex thereof.

9. An apparatus for printing fine patterns according to claim 8, wherein said reflective imaging optical means includes at least two concave mirrors and at least one convex mirror, and said concave mirrors and said convex mirror take the shape of a part of a rotationally symmetric face, with a central axis of rotational symmetry coinciding with a central axis of said circular cone.

10. An apparatus for printing fine patterns according to claim 7, wherein said elliptical mirror has a reflective surface of an elliptical multi-layer mirror having means for bandpass filtering.

11. An apparatus for printing fine patterns according to claim 6, comprising means for detecting dosage of said beam on the substrate, and means for controlling scanning speed of said scanning means on the basis of the detection result obtained by said means for detecting.

12. An apparatus for printing fine patterns according to claim 6, further including a table mounting said means for detecting dosage and the substrate and capable of moving in a 2-dimensional or 3-dimensional direction relative to said source, means for deflecting and optical means.

13. An apparatus for printing fine patterns according to claim 6, further including a detector for detecting a mounting position of the substrate disposed opposite said beam.

14. An apparatus for printing fine patterns according to claim 6, wherein said means for deflecting includes an elliptical mirror reflecting said beam and cooling means for said elliptical mirror.

15. The apparatus of claim 6, wherein said source provides said beam as polarized radiation having a vibration plane of its electric field diverging in a flat fan shape; and
said means for deflecting receiving the beam of flat fan shape and forming the beam into a converging narrow arc field with the vibrating plane being on a small arc portion of a cone converging to an entrance pupil position.

16. The apparatus of claim 15, wherein said means for deflecting is a concave mirror and the only optical element between said source and said mask.

17. The apparatus of claim 16, wherein said mirror is toroidal.

18. The apparatus of claim 16, wherein said mirror is an elliptical mirror with foci at said source and said entrance pupil position.

19. The apparatus of claim 18, wherein said mask is generally in a flat plane.

20. A fine pattern printing method for performing reduction projection of a pattern drawn on a mask onto a substrate via an imaging optical system by using a source emitting an X-ray or vacuum ultraviolet beam, said fine pattern printing method comprising the steps of:
providing said beam, at at least one point on an optical path between said source and said substrate, a reflecting mirror for reflecting said beam so as to bend said beam by approximately 90°; and
selecting the reflecting mirror so that the oscillation plane of a strongest electric field of said beam is not parallel to a plane including an incident beam and a reflected beam of said reflecting mirror.

21. The method of claim 20, wherein said providing provides the beam as polarized radiation having a vibrating electric field in a vibration plane; and
said selecting orients the oscillation plane substantially perpendicular to the plane including the incident and reflected beam.

22. The method of claim 21, including providing said beam with a flat narrow rectangular cross-sectional image shape at a position between the source and the optical element.

23. In an apparatus for printing fine patterns on a substrate including a source for emitting an X-ray or vacuum ultraviolet beam, means for applying said beam onto a mask, imaging optical means for focusing said beam from said mark onto the substrate, and positioning means for moving said substrate to desired positions, the improvement comprising:
a reflecting mirror disposed at at least one point on a beam path between said source and said to reflect said beam so as to bend said beam by approximately 90°; and
the oscillation plane of a strongest electric field of said beam being not parallel to a plane including an incident beam and a reflected beam of said reflecting mirror.

24. An apparatus for printing fine patterns according to claim 23, wherein said reflecting mirror comprises a multi-layer mirror.

25. An apparatus for printing fine patterns according to claim 23, wherein said source for emitting an X-ray or vacuum ultraviolet beam comprises a synchotron radiation source.

26. The apparatus of claim 23, wherein said source provides the beam as polarized radiation having a vibrating electric field in a vibration plane; and
said reflecting mirror is oriented so that the vibration plane is substantially perpendicular to the plane including the incident and reflected beams.

27. A fine pattern printing method for performing reduction projection of a pattern drawn on a mask onto a substrate via an imaging optical system by illuminating said mask with an X-ray or vacuum ultraviolet beam, said fine pattern printing method comprising the step of:
projecting the beam onto the substrate with a 0th order diffraction image and a higher than 0th order diffraction image; and
weakening the higher than 0th order diffraction image more than the oth order diffraction image.

28. The method of claim 27, wherein said weakening weakens with an optical element that weakens the higher order image about twice as much as the 0th order image.

29. The method of claim 28, including locating the optical element at about an entrance pupil position of the beam.

30. In an X-ray projection exposure apparatus including a source for emitting an X-ray or vacuum ultraviolet beam, imaging optical means for performing reduction projection of a pattern drawn on a mask onto a substrate, and positioning means for positioning said substrate in a predetermined position, the improvement comprising:

said imaging optical means including plural reflecting mirrors; and optical means for lowering the intensity of a peripheral part of said beam that is projected onto the substrate a greater amount than a central part of said beam that is projected onto the substrate, said optical means being disposed nearly in an entrance pupil position of said imaging optical system.

31. A fine pattern printing apparatus according to claim 30, wherein said optical means reflecting mirror comprises a multi-layer mirror.

32. A fine pattern printing apparatus according to claim 30, wherein said optical means comprises an X-ray transmission filter having a lower transmittance in the peripheral part thereof as compared with the transmittance of the central part thereof.

33. A fine pattern printing apparatus according to claim 30, wherein said source for emitting an X-ray or vacuum ultraviolet beam comprises a synchrotron radiation source.

34. A fine pattern printing apparatus according to claim 30, wherein said optical means comprises a reflecting mirror having a lower reflectivity in the peripheral part thereof as compared with the reflectivity of the central part thereof.

35. The apparatus of claim 34, wherein said reflecting mirror has a reflectivity at the peripheral part that is about one half the reflectivity at the central part.

36. The apparatus of claim 35, wherein said optical means reflecting mirror is located at about an entrance pupil position of the beam.

* * * * *